US007518925B2

(12) United States Patent
Kuramori

(10) Patent No.: US 7,518,925 B2
(45) Date of Patent: Apr. 14, 2009

(54) NONVOLATILE SEMICONDUCTOR MEMORY

(75) Inventor: Bunsho Kuramori, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/751,082

(22) Filed: May 21, 2007

(65) Prior Publication Data

US 2008/0043539 A1  Feb. 21, 2008

(30) Foreign Application Priority Data

Aug. 17, 2006  (JP) .............................. 2006-222436

(51) Int. Cl.
*G11C 16/04* (2006.01)
(52) U.S. Cl. .............................. 365/185.18; 365/185.23
(58) Field of Classification Search ............ 365/185.18, 365/185.21, 185.22, 185.23, 185.25
See application file for complete search history.

(56) References Cited

U.S. PATENT DOCUMENTS 6,081,452 A * 6/2000 Ohta ..................... 365/185.22
6,243,297 B1 * 6/2001 Nagatomo ............. 365/185.25

FOREIGN PATENT DOCUMENTS

JP  2005-050423  2/2005

* cited by examiner

*Primary Examiner*—Gene N. Auduong
(74) *Attorney, Agent, or Firm*—Volentine & Whitt, P.L.L.C.

(57) ABSTRACT

A nonvolatile semiconductor memory for suppressing the access delay due to the parasitic capacitance between bit lines is disclosed. Bit lines are selected by a bit select signal, and the data of the memory cell selected in accordance with the level of data lines by a sense amplifier are read, after which the read data are held in a latch circuit. Then, a control signal is set to "High", thereby to turn on a NMOS and set the data lines to a grounding potential. As a result, the charges of the selected bit lines are discharged. After that, even if adjacent bit lines are selected next for reading, the effect of the parasitic capacitance between the adjacent bit lines is obviated, and the next data can be read without causing any access delay.

9 Claims, 7 Drawing Sheets

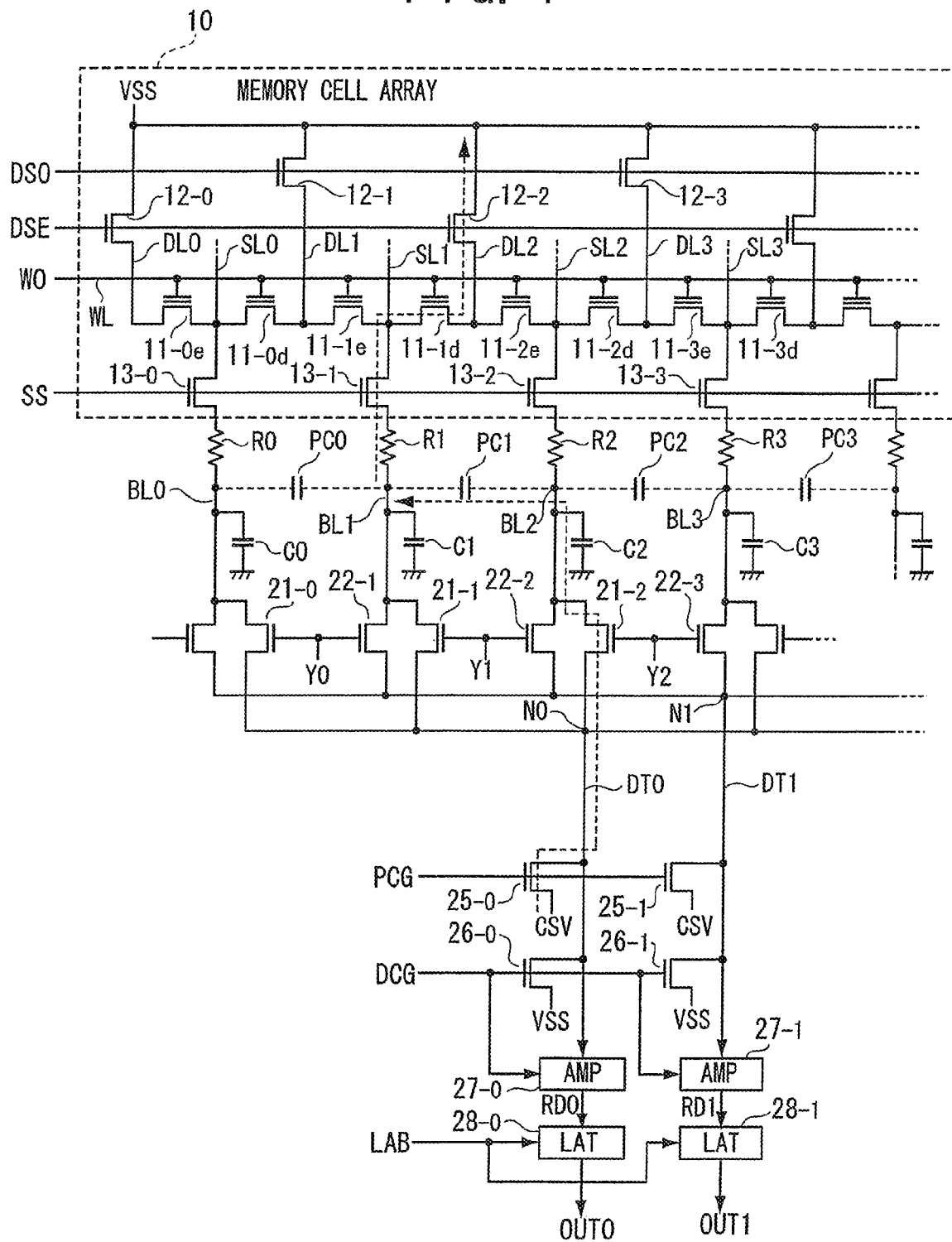
F I G. 1

SIGNAL WAVEFORMS OF EPROM SHOWN IN FIG. 1

SIGNAL WAVEFORMS OF EPROM SHOWN IN FIG. 4

SIGNAL WAVEFORMS OF EPROM SHOWN IN FIG. 6

NONVOLATILE SEMICONDUCTOR MEMORY

CROSS-REFERENCE TO RELATED APPLICATIONS

This application claims priority under 35 USC 119 from Japanese Patent Application No. 2006-222436, the disclosure of which is incorporated by reference herein.

BACKGROUND OF THE INVENTION

1. Field of the Invention

This invention relates to a nonvolatile semiconductor memory such as EPROM (Erasable and Programmable Read-Only Memory).

2. Description of the Related Art

Japanese Patent Application Laid-Open (JP-A) No. 2005-50423 discloses a technique for suppressing read access delay due to a parasitic capacitance between the bit lines of EPROM. This EPROM includes an actual cell amplifier, a reference amplifier and a sense amplifier for comparing output levels of the actual cell amplifier and the reference amplifier with each other and outputting a read signal. The actual cell amplifier amplifies the potential of the bit line of which the level changes in accordance with on/off state of a memory cell selected for reading. The reference amplifier amplifies the potential of the bit line connected with a reference cell which is set to a comparative conduction state. A transistor in forward direction diode connection is connected between the bit line at the input side (end) of the actual cell amplifier and a grounding potential, and another transistor in forward direction diode connection is connected between the bit line at the input side of the reference amplifier and the grounding potential.

In this EPROM, when a memory cell in off state with data 0 written therein is read, the drain of this memory cell is connected to the grounding potential by the transistor driven by a select signal. Since the memory cell is in off state, no current flows in the memory cell. However, due to the parasitic capacitance between the bit line connected with the source of the memory cell and the bit line connected with the drain of the memory cell, the potential of the bit line connected with the source of the memory cell (i.e., the bit line connected to the input side of the actual cell amplifier) is pulled by the grounding potential, and therefore, a charge current flows to the bit line from the input side of the actual cell amplifier. On the other hand, the input side of the actual cell amplifier is connected to the grounding potential by the transistor in forward diode connection, and therefore, DC current flows to the grounding potential through this transistor. As a result, the charge start timing of the parasitic capacitance is made short and read delay time of reading is reduced.

The EPROM described above, however, is a circuit for increasing initial charge speed from the sense amplifier, and fails to take into consideration the initial potential of the selected bit line which is changed according to the operating condition. Therefore, a sufficient effect may not be obtained for all the read operations.

SUMMARY OF THE INVENTION

According to the present invention, there is provided a nonvolatile semiconductor memory using a sense amplifier of current detection type, which can suppress the access delay due to the parasitic capacitance between the bit lines.

One aspect of the invention provides a nonvolatile semiconductor memory including: a memory cell array including a plurality of word lines arranged in parallel to each other, a plurality of drain lines and source lines arranged alternately across the word lines, and a plurality of nonvolatile memory cells arranged at the intersections of the word lines, the drain lines and the source lines, each of the memory cells having a control gate electrode, a drain electrode and a source electrode, each electrode being connected to a corresponding one of the word lines, the drain lines and the source lines, and the drain lines being connected to a first potential; a select circuit which selects source lines designated by a select signal from among the plurality of the source lines and connecting the selected source lines to data lines respectively; a charge circuit which charges the selected source lines by connecting the data lines to a second potential for a predetermined length of time when a data read operation is initiated; a data output circuit which reads and holds data from a nonvolatile memory cell corresponding to the selected source lines, based on quantities of current flowing ill the data lines after the predetermined length of time has elapsed; and a discharge circuit which discharges charges of the selected source lines by connecting the data lines to the first potential after reading the data from the nonvolatile memory cell.

The nonvolatile semiconductor memory according to this aspect includes a data output circuit for reading and holding, based on the current flowing in data lines, the data stored in a nonvolatile memory cell corresponding to selected source lines, and a discharge circuit for discharging the selected source line by connecting the data lines to a first potential after reading the data from the nonvolatile memory cell. After the data is read, charges held on the source line read is released (discharged), and therefore, the effect of the parasitic capacitance between the source lines to be read next is suppressed, thereby making it possible to suppress the access delay.

BRIEF DESCRIPTION OF THE DRAWINGS

Exemplary embodiments of the present invention will be described in detail based on the following figures, wherein:

FIG. 1 is a diagram showing the configuration of an EPROM according to a first embodiment of the present invention;

DETAILED DESCRIPTION OF THE INVENTION

Figure 2:
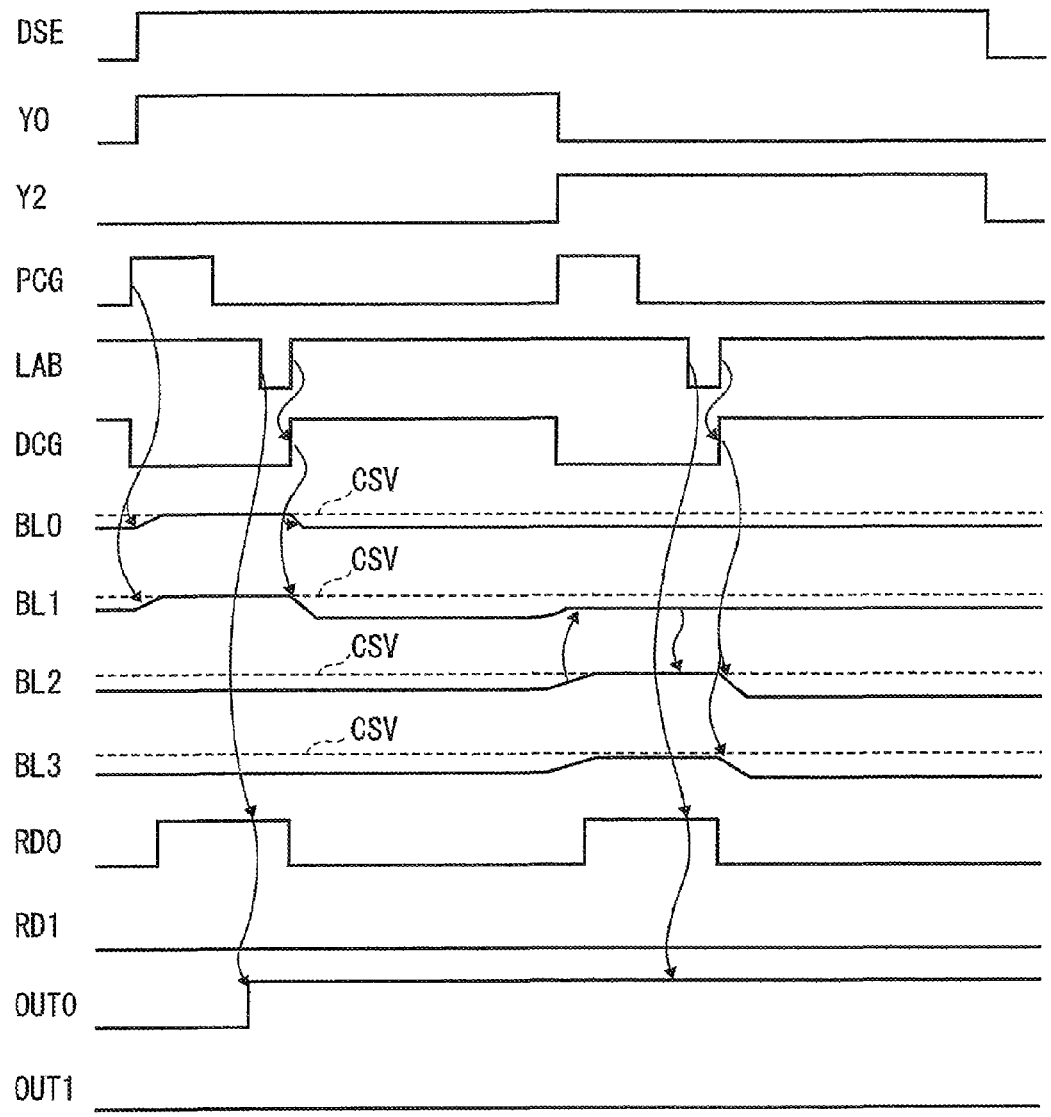
FIG. 2 is a diagram showing signal waveforms of the operation of the EPROM of FIG. 1.

The above-described and other features and advantages will be made apparent by the detailed description taken in conjunction with the accompanying drawings. The drawings, however, are only intended for illustration and not to be interpreted to limit the scope of the invention.

First Embodiment

FIG. 1 is a diagram showing a configuration of an EPROM according to the first embodiment of the invention.

This EPROM has a memory cell array 10 for storing data. The memory cell array 10 includes plural parallel word lines WLi (i=0 to m) (only one is shown in FIG. 1) and plural drain lines DLj (j=0 to n) arranged across (to intersect) the word lines WLi. Further, a source line SLj is arranged between each pair of the drain lines DLj and DLj+1 in parallel thereto.

A memory cell 11-je is arranged at the intersection of each word line WLi, drain line DLj and source line SLj, and a memory cell 11-jd is arranged at the intersection of each word line WLi, drain line DLj+1 and source line SLj. Hereinafter, the affixes i, j are not shown except for a case that designating the component elements specifically.

The memory cell 11 is a field-effect transistor having a floating gate electrode isolated from the surrounding, in which the control gate electrode, the drain electrode and the source electrode are connected to the corresponding word line WL, drain line DL and source line SL, respectively. The floating gate electrode of the memory cell 11 has no charge in unwritten state (data "1") and the threshold voltage thereof is low, and it is turned on when selected by the word line WL. When a high voltage is applied to the control gate electrode for write operation (data "0"), the charge is accumulated in the floating gate electrode and the threshold voltage increases, thereby the memory cell 11 is turned off. As a result, the charge of the floating gate electrode is not discharged simply by switching off the power supply, and the stored contents are retained.

Each drain line DLj is connected to the grounding potential VSS through an N-channel MOS transistor (hereinafter referred to as NMOS) 12-j. The gate of each even-numbered NMOS 12 is supplied with a common drain select signal DSE, while the gate of each odd-numbered NMOS 12 is supplied with a common drain select signal DSO. Further, each word line WLi is supplied with a common word select signal Wi.

Each source line SLj is connected to a bit line BLj through NMOS 13-j. The gate of each NMOS 13 is supplied with a common select signal SS, whereby the memory cell array 10 is selected and connected to the bit line BL. Each bit line BL has a parasitic capacitance PC (1.102 pF, for example) between adjacent bit lines in addition to the floating capacitance C (0.33 pF, for example) between a wiring resistance (992 Ω, for example) and a common potential GND.

The bit line BL0 is connected to a node N0 through NMOS 21-0, and the bit line BLn is connected to node N1 through NMOS 22-n. The bit lines BL1 to BLn-1 are connected to the nodes N0 or N1 through NMOS 21-1 to 21-n-1 and NMOS 22-1 to 22-n-1, respectively. The gates of NMOS 21-j and NMOS 22-j+1 are supplied with a bit select signal Yj.

The nodes N0 and N1 are connected with the data lines DT0 and DT1, respectively. The data line DT0 is connected to a sense level CSV (0.9 V, for example) and the grounding potential VSS through NMOS 25-0 and 26-0, respectively, and further connected to a sense amplifier (AMP) 27-0. The data line DT1, is connected with the sense level CSV and the grounding potential VSS through NMOS 25-1 and 26-1, respectively, and further connected to a sense amplifier 27-1. The gates of NMOS 25-0 and 25-1 are supplied with a precharge control signal PCG, and the gates of NMOS 26-0 and 26-1 are supplied with a discharge control signal DCG. This control signal DCG is also applied to the sense amplifiers 27-0 and 27-1 as an operation control signal.

The sense amplifiers 27-0 and 27-1 detect the current flowing through the data lines DT0 and DT1, and read the data from the selected memory connected to the data lines DT0 and DT1. The outputs of the sense amplifiers 27-0 and 27-1 are connected to latch circuits (LAT) 28-0 and 28-1, respectively. The latch circuits 28-0 and 28-1 hold the data RD0 and RD1 read out by the sense amplifiers 27-0 and 27-1 in accordance with a latch signal LAB, and output output signals OUT0 and OUT1.

The control signal PCG is a signal that, upon selection of the bit line BL in read operation, the level rises to "H (High)" level and charges the selected bit line BL to the sense level CSV for the first predetermined length of time. The latch signal LAB is a pulse signal which the level falls to "L (Low)" to hold the read data RD output from the sense amplifier 27 in the latch circuit 28 at a timing when the output of the sense amplifier 27 is assumed to be settled. The control signal DCG discharges the selected bit line BL while activating the sense amplifier 27. Specifically, the control signal DCG falls to "L" and activates the sense amplifier 27 while turning off the NMOS 26 when the control signal PCG is initiated, and the control signal DCG rises to "H" and turns off the sense amplifier 27 while turning on the NMOS 26 to discharge the bit line BL, when the latch signal LAB is initiated.

FIG. 2 shows signal waveforms of the EPROM shown in FIG. 1. With reference to FIG. 2, the operation of the circuit shown in FIG. 1 is explained below.

First, in order to clarify the effects of the present invention, an explanation is given about the operation in the absence of the NMOS 26-0 and 26-1 for discharging and the latch circuits 28-0 and 28-1.

When reading the memory cell 11-1d with data "1" stored therein, for example, the select signal SS, the word select signal W0 and the drain select signal DSE are set to "H", and the bit select signal Y0 is also set to "H". Further, the control signal PCG is set to "H" for a predetermined length of time, and thereby the bit lines BL0 and BL1 selected by the bit select signal Y0 are charged almost to the sense level CSV. At this time, the memory cell 11-1d has data "1" (i.e., is in on state), and therefore, the bit line BL1 is connected to the grounding potential VSS via the memory cell 11-1d and the potential thereof is reduced. The current flowing in the bit line BL1 is detected by the sense amplifier 27-1 through the data line DT1, and the contents stored in the memory cell 11-1d are output as the read data RD1.

When the adjacent memory cell 11-2e storing data "0" therein is read out subsequently, the bit select signal Y2 is set to "H" and the control signal PCG is held at "H" for the predetermined length of time. As a result, the bit lines BL2 and BL3 are selected and charged almost to the sense level CSV. At this time, the previously selected bit line BL1 still maintains a level near the sense level CSV. However, the level of the bit line BL1 will actually rise to a level of CSV+α under the effect of coupling with the bit line BL2 due to the parasitic capacitance PC1. Then, the charges on the bit line BL1 as shown by dotted line in FIG. 1, starts to leak to the grounding potential VSS through the memory cell 11-1d. Since the level of the bit line BL1 is high, the leak current will be large. The effect of this leak current is propagated to the bit line BL2 through the parasitic capacitance PC1 between the bit lines BL1 and BL2, and thereby leak of current also occurs in the bit line BL2 as shown by dotted line in FIG. 1. Due to this leak current, the determination of the expected value "0" of the bit line BL2 is delayed, thereby causing an access delay.

Next, an explanation is given about the operation in the presence of the discharge NMOS 26-0 and 26-1 and the latch circuits 28-0 and 28-1 constituting the features of the present invention.

When reading the memory cell 11-1*d* having data "1" stored therein, the select signal SS, the word select signal W0 and the drain select signal DSE are set to "H". At this time, the control signal DCG falls to "L", and the NMOS 26 turns off, while the sense amplifier 27 is activated. Further, the control signal PCG is set to "H" for a predetermined length of time. Then, the bit lines BL0 and BL1 selected by the bit select signal Y0 are charged substantially to the sense level CSV through the data lines DT0 and DT1.

After that, the control signal PCG falls to "L". Since the memory cell 11-1*d* is in on state, the bit line BL1 is connected to the grounding potential VSS through the memory cell 11-1*d* and the potential thereof falls. The current flowing in the bit line BL1 is detected by the sense amplifier 27-1 through the data line DT1, and the contents stored in the memory cell 11-1*d* are output as the read data RD1.

At the timing when the read data RD1 output from the sense amplifier 27-1 are settled, the latch signal LAB is output, and the read data RD1 is held in the latch circuit 28-1 and output as the output signal OUT1.

Once the latch signal LAB returns to "H", the control signal DCG rises to "H". As a result, the NMOS 26 turns on, and the sense amplifier 27 turns off. Due to the turning on of the NMOS 26, the data lines DT0 and DL1 are connected to the grounding potential VSS, and the selected bit lines BL0 and BL1 are discharged substantially to the grounding potential VSS. Since the read data RD1 is already held in the latch circuit 28-1, the output signal OUT1 remains unchanged.

In the case where the adjacent memory cell 11-2*e* storing data "0" therein is subsequently read, the bit select signal Y2 is set to "H" and a similar read operation is performed. Since the bit line BL1 adjacent to the selected bit line BL2 is already discharged substantially to the grounding potential VSS, the potential of the bit line BL1 will not increase beyond CSV even under the effect of the coupling with the bit line BL2 due to the parasitic capacitance PC1. Further, since the level of the bit line BL1 is low, the leak current is suppressed to a small amount. Thus, the expected value "0" of the bit line BL2 can be determined without any access delay occurring.

As described above, the EPROM according to the first embodiment includes the latch circuit 28 for retaining the read data RD0 and RD1 read by the sense amplifier 27 and the NMOS 26 for discharging charges of the selected bit line BL through the data lines DT0 and DL1 after retaining the read data RD0 and RD1 in the latch circuit 28. As a result, the bit line BL which the read operation is complete is discharged. Therefore, the current due to the parasitic capacitance PC between the bit lines BL to be read is suppressed, and therefore, the correct data can be read without causing any access delay.

Second Embodiment

Figure 3:
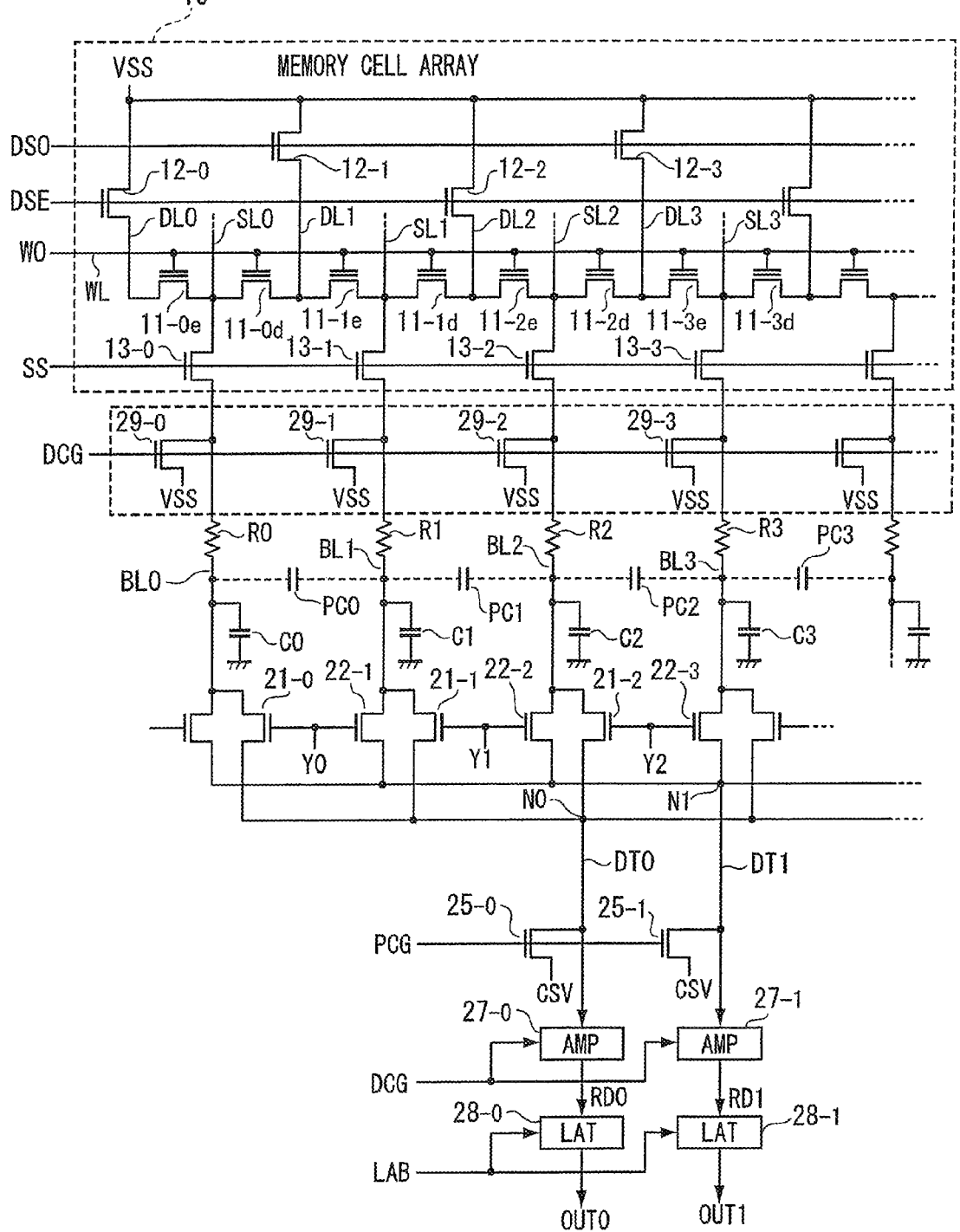
FIG. 3 is a diagram showing the configuration of an EPROM according to a second embodiment of present invention.

FIG. 3 is a diagram showing a configuration of an EPROM according to a second embodiment of the present invention. In FIG. 3, the same elements as those in FIG. 1 are designated by the same reference numerals, respectively.

In this EPROM, the discharge NMOS 26-0 and 26-1 arranged on the data lines DT1 and DL2 in FIG. 1 are replaced by discharge NMOS 29-*j* arranged on each bit line BL*j*. Specifically, the drain of the NMOS 29-*j* is connected to the bit line BL*j*, the source thereof is connected to the grounding potential VSS, and the gate thereof is supplied with a common discharge control signal DCG. The other components of the EPROM are similar to those of FIG. 1.

This EPROM operates in such a manner that when the control signal DCG is set at "H", all the bit lines BL*j* are connected to the grounding potential VSS through the NMOS 29-*j* and all discharged at once. In the other respects, this EPROM operates in a similar manner to the EPROM shown in FIG. 1.

Third Embodiment

Figure 4:
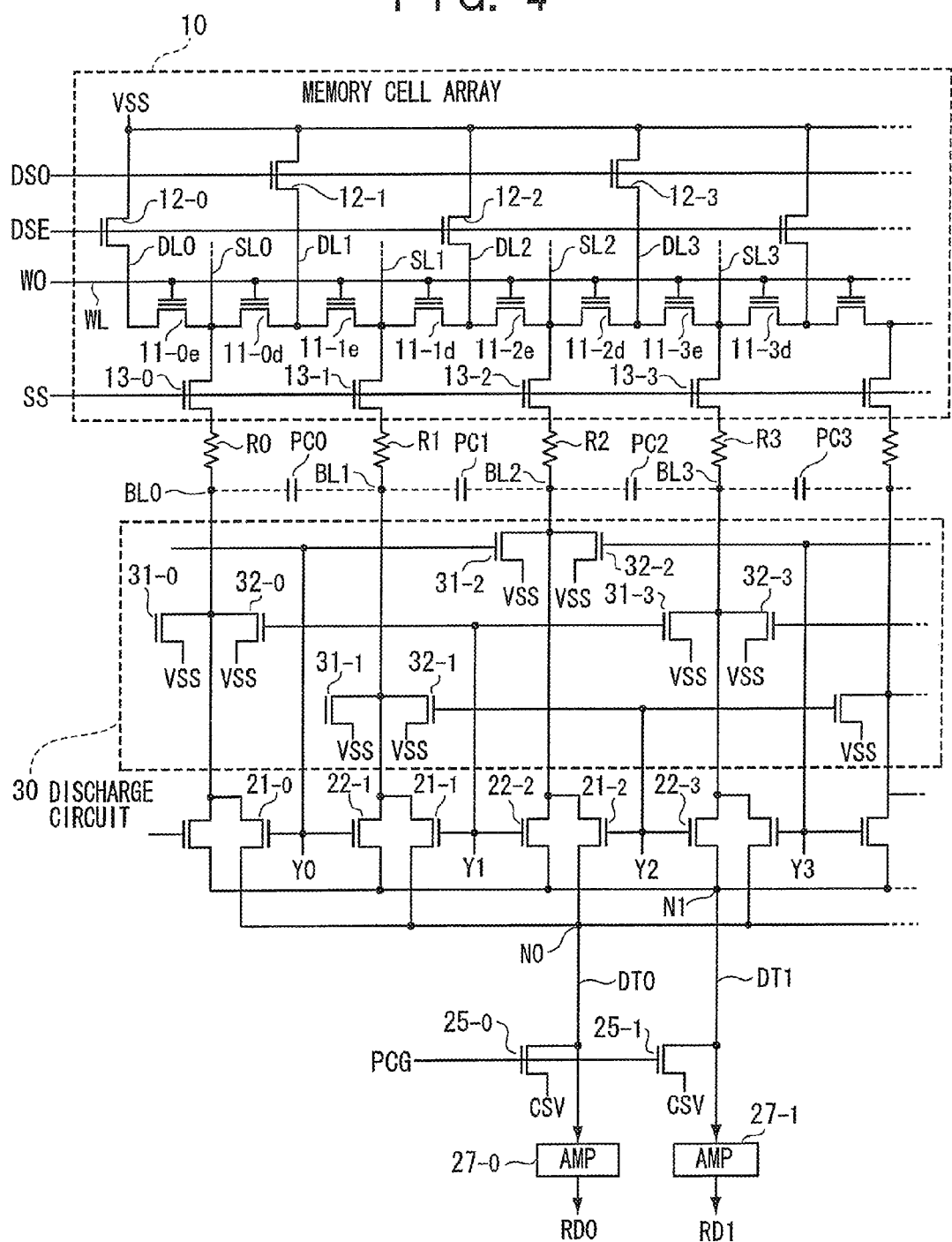
FIG. 4 is a diagram showing the configuration of an EPROM according to a third embodiment of the present invention.

FIG. 4 is a diagram showing a configuration of an EPROM according to a third embodiment of the present invention. In FIG. 4, the same elements as those of FIG. 1 are designated by the same reference numerals, respectively.

In this EPROM, the discharge NMOS 26-0 and 26-1 and the latch circuits 28-0 and 28-1 of FIG. 1 are eliminated, and a discharge circuit 30 for discharging the bit line adjacent to the pair of bit lines selected by the bit select signal Y*j* is added.

The discharge circuit 30 is configured to include discharge NMOS 31-*j* and 32-*j* for each bit line BL*j*. Specifically, the drains of NMOS 31-*j* and 32-*j* are connected to the bit line BL*j*, and the sources thereof are connected to the grounding potential VSS. The gate of NMOS 31-*j* is supplied with the bit select signal Y*j*−2, and the gate of NMOS 32-*j* is supplied with the bit select signal Y*j*+1. The other components of the EPROM are similar to those of FIG. 1, respectively.

Figure 5:
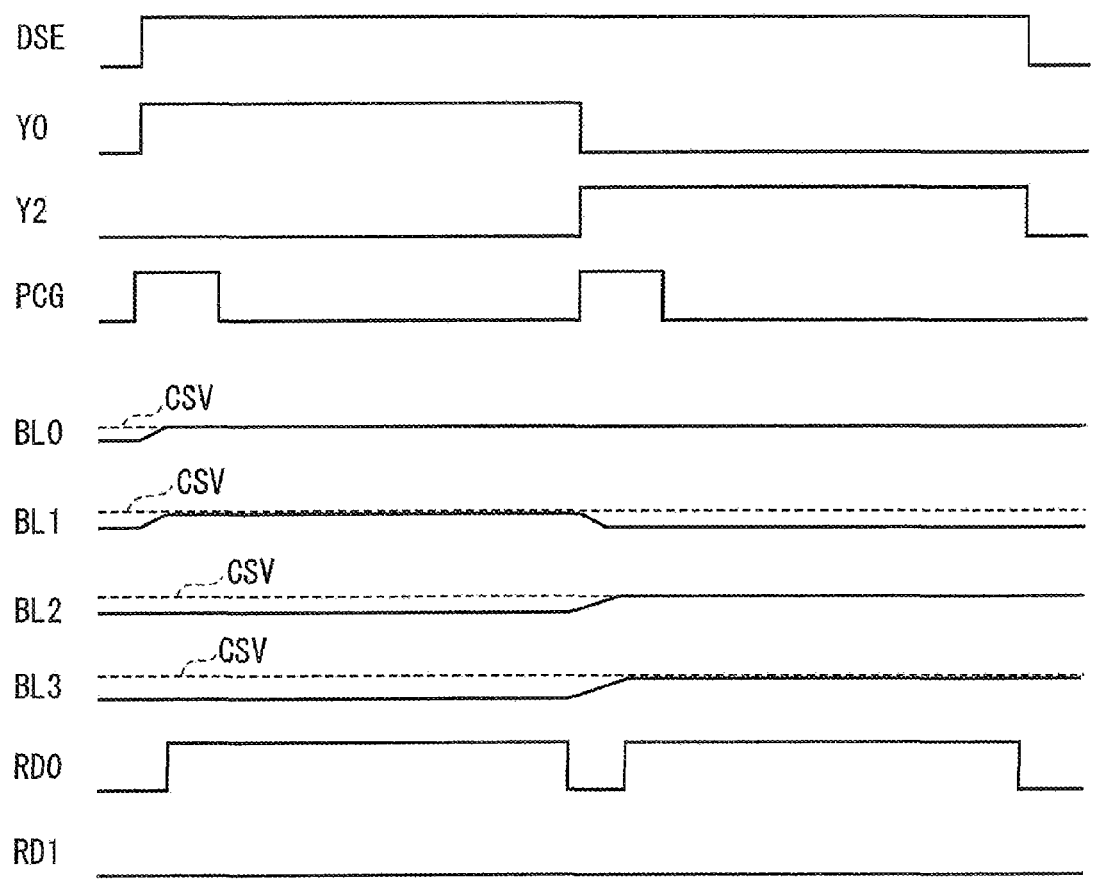
FIG. 5 is a diagram showing signal waveforms of the operation of the EPROM of FIG. 4.

FIG. 5 shows signal waveforms representing the operation of the EPROM shown in FIG. 4. With reference to FIG. 5, the operation of the EPROM shown in FIG. 4 is explained below.

When reading the memory cell 11-1*d* storing data "1" therein, for example, the select signal SS, the word select signal W0 and the drain select signal DSE are set to "H", and the bit select signal Y0 is also set to "H". As a result, the bit lines BL0 and BL1 are selected and connected to the data lines DT0 and DL1 respectively. At this times, the bit line BL2 adjacent to the bit lines BL0 and BL1 is connected to the grounding potential VSS through the NMOS 31-2 that has been turned on by the bit select signal Y0.

By setting the control signal PCG to "H" for a predetermined length of time, the selected bit lines BL0 and BL1 are charged substantially to the sense level CSV. Since the memory cell 11-1*d* is in on state at this time, the bit line BL1 is connected to the grounding potential VSS through the memory cell 11-1*d* and the potential thereof falls. The current flowing in the bit line BL1 is detected by the sense amplifier 27-1 through the data line DT1, and the contents stored in the memory cell 11-1*d* are output as the read data RD1.

When the adjacent memory cell 11-2*e* storing data "0" therein is subsequently read, the bit select signal Y2 is raised to "H", and the control signal PCG is also set to "H" for a predetermined length of time. As a result, the bit lines BL2 and BL3 are selected and charged substantially to the sense level CSV. At this time, the adjacent bit line BL1 selected previously is connected to the grounding potential VSS through the NMOS 32-1 turned on by the bit select signal Y2. The bit line BL2, therefore, is not affected by the coupling with the adjacent bit line BL1 due to the parasitic capacitance PC1. The contents stored in the memory cell 11-2*e* which have been read from the bit line BL2 through the data line DT0 and detected by the sense amplifier 27-0 are output as the read data RD0.

As described above, the EPROM according to the third embodiment includes the discharge circuit 30 for discharging the bit line adjacent to the selected pair of bit lines at the time of the read operation. As a result, charges of the bit line BL adjacent to the bit line to be read are discharged. Thus, leak current due to the parasitic capacitance PC between the bit line BL to be read and the adjacent bit line is suppressed, and the correct data can be read without any access delay.

Fourth Embodiment

Figure 6:
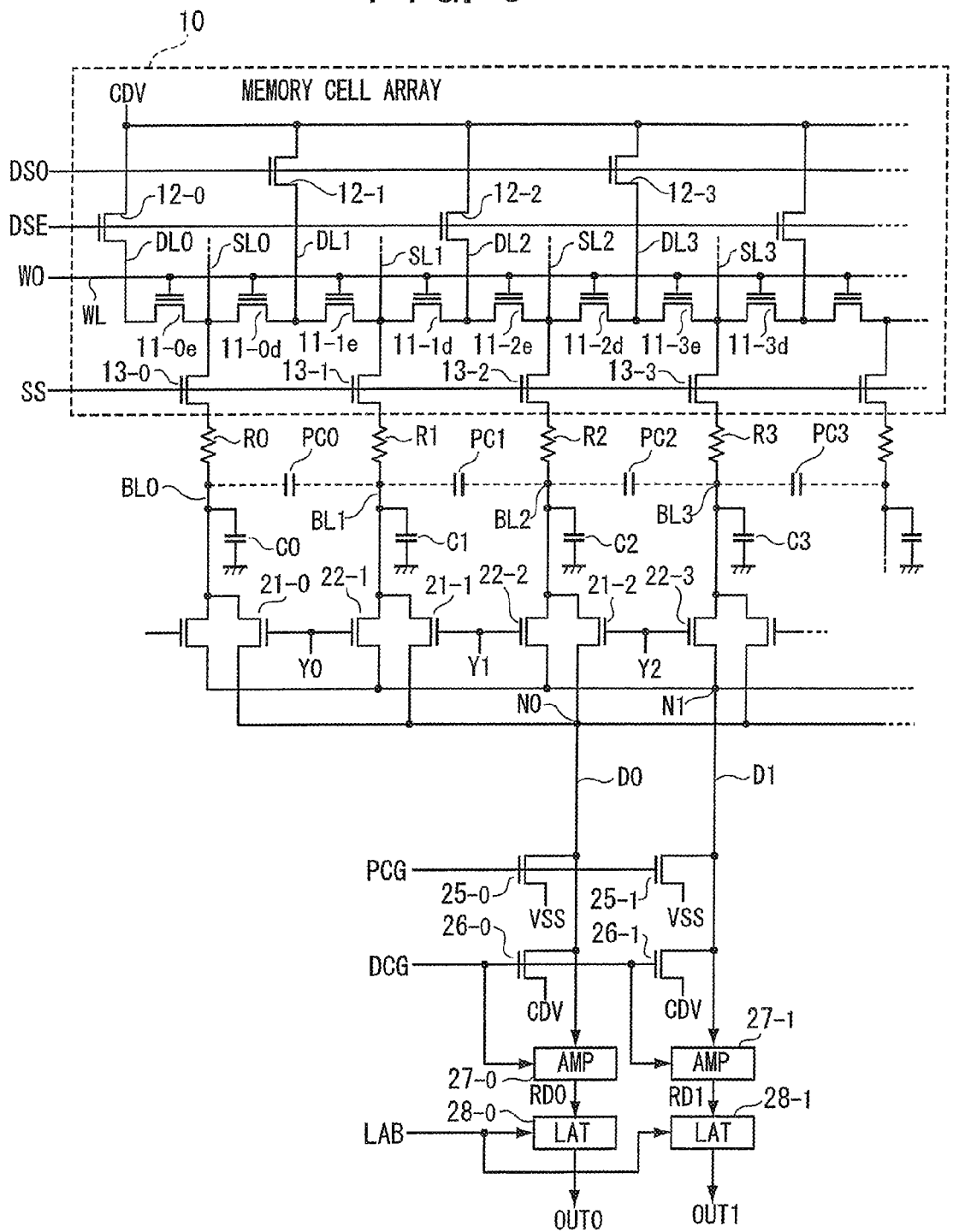
FIG. 6 is a diagram showing the configuration of an EPROM according to a fourth embodiment of the present invention.

FIG. 6 is a diagram showing a configuration of an EPROM according to a fourth embodiment of the present invention. In FIG. 6, the same elements as those in FIG. 1 are designated by the same reference numerals, respectively.

The circuit configuration of this EPROM similar to that of FIG. 1 except for the potential to which the drain line DLj is connected and the potential to which the data lines DT0 and DT1 are connected at the time of precharge and discharge are different from those in the embodiment of FIG. 1. Specifically, each drain line DLj is connected to cell drain level CDV (0.9 V, for example) through the NMOS 12-j. Further, the data lines DT0 and DT1 are connected to the grounding potential VSS through the NMOS 25-0 and 25-1, respectively, and also are connected to the cell drain level CDV through the NMOS 26-0 and 26-1. In this EPROM, the sense amplifiers 27-0 and 27-1 are adapted to read the data of the selected memory cell 11 by detecting the current influent from the data lines D0 and D1.

Figure 7:
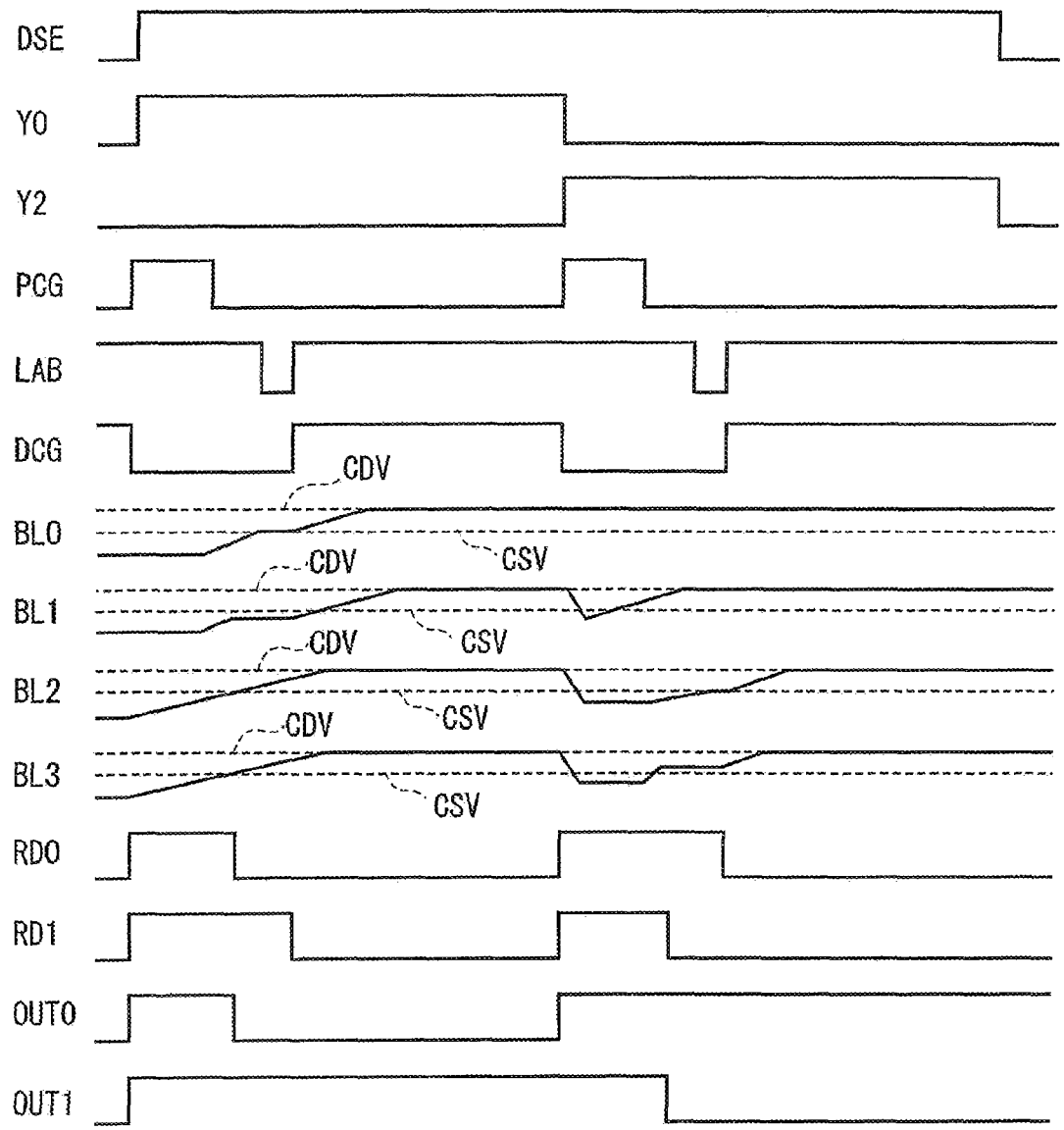
FIG. 7 is a diagram showing signal waveforms of the operation of the EPROM of FIG. 6.

FIG. 7 shows signal waveforms of the operation of the EPROM shown in FIG. 6.

In this EPROM, the control signal DCG for controlling the sense amplifier 27 falls to "L" at the time of reading new data, and after maintaining the "L" level until the read data RD0 and RD1 of the sense amplifier 27 are held in the latch circuit 28 by the latch signal LAB, returns to "H". When the control signal DCG returns to "H", the sense amplifier 27 is deactivated, the NMOS 26 turns on, and the data lines DT0 and DT1 are connected to the cell drain level CDV. As a result, the bit line BL selected by the bit select signal Yj is charged to the sense level CDV. At this time, the read data RD0 and RD1 of the sense amplifier 27 are already held in the latch circuit 28, from which the normal output signals OUT0 and OUT1 are output.

Upon the control switches to the next selected address, the control signal DCG falls again to "L", and the sense amplifier 27 is activated to perform the read operation. At this time, the previously selected bit line BL is already charged to the cell drain level CD-V. Therefore, even in the case where the data lines DT0 and DT1 are discharged to the grounding potential VSS by the control signal PCG, the potential of the bit line BL will not decreased to VSS-α under the effect of the coupling between the bit lines due to the parasitic capacitance PC. As a result, the leak current is suppressed, and correct data can be read without causing any access delay.

The present invention is not limited to the exemplary embodiments described above, but can be variously modified, such as some examples which are described below:

(1) In the Figures, only one memory cell array 10 is shown, and therefore, the source lines SL and the bit lines BL of the memory cell array 10 are in one-to-one correspondence. However, plural memory cell arrays 10 can be connected in parallel to each other. In this case, one of the memory cell arrays 10 may be selected and connected to the bit lines BL by the select signal SS provided for each memory cell array.

(2) The memory cell array 10 shown in the Figures is configured such that the even-numbered and odd-numbered memory cells are accessed at the same time. However, the present invention is applicable also to the memory cell array configured such that one memory cell is selected at a time.

(3) The EPROM shown in FIGS. 3 and 4 may have such a configuration, such as the EPROM shown in FIG. 6, such that the drain line DL of the memory cell array 10 and the sources of the discharge NMOS 29, 31, and 32 are connected to the cell drain level CDV, the source of the precharge NMOS 25 is connected to the grounding potential VSS, and the sense amplifier reads the data in accordance with the influent current.

What is claimed is:

1. A nonvolatile semiconductor memory comprising:
   a memory cell array including a plurality of word lines arranged in parallel to each other, a plurality of drain lines and source lines arranged alternately across the word lines, and a plurality of nonvolatile memory cells arranged at intersections of the word lines, the drain lines and the source lines, each of the memory cells having a control gate electrode, a drain electrode and a source electrode, each electrode being connected to a corresponding one of the word lines, the drain lines and the source lines, and the drain lines being connected to a first potential;
   a select circuit which selects source lines designated by a select signal from among the plurality of the source lines and connects the selected source lines to data lines respectively;
   a charge circuit which charges the selected source lines by connecting the data lines to a second potential for a predetermined length of time when a data read operation is initiated;
   a data output circuit which reads and holds data from a nonvolatile memory cell corresponding to the selected source lines, based on quantities of current flowing in the data lines after the predetermined length of time has elapsed; and
   a discharge circuit which discharges charges of the selected source lines by connecting the data lines to the first potential after reading the data from the nonvolatile memory cell.

2. The nonvolatile semiconductor memory according to claim 1, wherein the first potential is a grounding potential and the second potential is a sense level which determines the data of the nonvolatile memory cell.

3. The nonvolatile semiconductor memory according to claim 1, wherein the first potential is a sense level which determines the data of the nonvolatile memory cell and the second potential is a grounding potential.

4. A nonvolatile semiconductor memory comprising:
   a memory cell array including a plurality of word lines arranged in parallel to each other, a plurality of drain lines and source lines arranged alternately across the word lines, and a plurality of nonvolatile memory cells arranged at intersections of the word lines, the drain lines and the source lines, each of the memory cells having a control gate electrode, a drain electrode and a source electrode, each electrode being connected to a corresponding one of the word lines, the drain lines and the source lines, and the drain lines being connected to a first potential;
   a select circuit which selects source lines designated by a select signal from among the plurality of the source lines and connects the selected source lines to data lines respectively;
   a charge circuit which charges the selected source lines by connecting the data lines to a second potential for a predetermined length of time when a data read operation is initiated;

a data output circuit which reads and holds data from a nonvolatile memory cell corresponding to the selected source lines, based on quantifies of current flowing in the data lines after the predetermined length of time has elapsed; and a discharge circuit which discharges charges of the source lines by connecting the plurality of the source tines to the first potential after reading data from the nonvolatile memory cell.

5. The nonvolatile semiconductor memory according to claim 4, wherein the first potential is a grounding potential and the second potential is a sense level which determines the data of the nonvolatile memory cell.

6. The nonvolatile semiconductor memory according to claim 4, wherein the first potential is a sense level which determines the data of the nonvolatile memory cell and the second potential is a grounding potential.

7. A nonvolatile semiconductor memory comprising:

a memory cell array including a plurality of word lines arranged in parallel to each other, a plurality of drain lines and source lines arranged alternately across the word lines, and a plurality of nonvolatile memory cells arranged at intersections of the word lines, the drain lines and the source lines, each of the memory cells having a control gate electrode, a drain electrode and a source electrode, each electrode being connected to a corresponding one of the word lines, the drain lines and the source lines, and the drain lines being connected to a first potential;

a select circuit which selects the source lines designated by a select signal from among the plurality of the source lines and connects the selected source lines to the data lines respectively;

a discharge circuit which discharges charges of a source line adjacent to the source lines designated by the select signal by connecting the adjacent source line to the first potential;

a charge circuit which charges the selected source lines by connecting the data lines to a second potential for a predetermined length of time when a data read operation is initiated; and a data output circuit which reads data from a nonvolatile memory cell corresponding to the selected source lines, based on quantities of current flowing in the data lines after the predetermined length of time has elapsed.

8. The nonvolatile semiconductor memory according to claim 7, wherein the first potential is a grounding potential and the second potential is a sense level which determines the data of the nonvolatile memory cell.

9. The nonvolatile semiconductor memory according to claim 7, wherein the first potential is a sense revel which determines the data of the nonvolatile memory cell and the second potential is a grounding potential.

* * * * *